United States Patent
Tanaka et al.

(10) Patent No.: US 6,391,460 B1
(45) Date of Patent: May 21, 2002

(54) RUBBER FOR HOT PRESS CUSHIONING PAD, MANUFACTURING METHOD THEREOF, HOT PRESS CUSHIONING PAD AND METHOD OF MANUFACTURING PRINTED CIRCUIT BOARD

(75) Inventors: Atsuo Tanaka, Yawata; Akira Yoshida, Kanuma, both of (JP)

(73) Assignee: Yamauchi Corporation, Osaka (JP)

( * ) Notice: Subject to any disclaimer, the term of this patent is extended or adjusted under 35 U.S.C. 154(b) by 0 days.

(21) Appl. No.: 09/368,361

(22) Filed: Aug. 5, 1999

(30) Foreign Application Priority Data

Aug. 6, 1998 (JP) .......................... 10-223162

(51) Int. Cl.[7] .................. B32B 15/06; B32B 25/08; B32B 25/10; B32B 25/16
(52) U.S. Cl. .................. 428/421; 428/463; 428/492; 428/494; 428/519; 428/520; 428/522; 442/289; 442/397; 526/242; 526/255; 264/345
(58) Field of Search .................. 428/421, 422, 428/463, 461, 492, 494, 500, 515, 519, 520, 522; 526/242, 250, 253, 254, 255; 442/289, 397; 264/345

(56) References Cited

U.S. PATENT DOCUMENTS

| | | | | |
|---|---|---|---|---|
| 4,690,994 A | * | 9/1987 | Masuda et al. | ............. 526/254 |
| 4,985,520 A | * | 1/1991 | Hayashi et al. | ............. 526/254 |
| 5,202,372 A | * | 4/1993 | Moggi et al. | ............. 524/462 |
| 5,755,045 A | | 5/1998 | Mashita et al. | |
| 5,891,941 A | * | 4/1999 | Tanaka et al. | ............. 524/232 |
| 5,994,487 A | * | 11/1999 | Enokida et al. | ............. 526/247 |
| 6,127,031 A | * | 10/2000 | Fukumoto | ............. 428/323 |

FOREIGN PATENT DOCUMENTS

| | | |
|---|---|---|
| EP | 0703069 | 3/1996 |
| JP | 62 42814 | 2/1987 |
| JP | 2 18988 | 1/1990 |
| JP | 4201442 | 7/1992 |
| JP | 6-278153 | * 10/1994 |
| JP | 7 12617 | 2/1995 |
| JP | 8148814 | 6/1996 |
| JP | 8224849 | 9/1996 |
| JP | 8290434 | 11/1996 |
| JP | 2649899 | 5/1997 |
| JP | 2650727 | 5/1997 |

OTHER PUBLICATIONS

Chemical Astracts, vol. 122, No. 12, Mar. 20, 1995, Columbus, Ohio, USA; abstract No. 135868, XP002123016 (JP 06 278153A: Yamauchi Corp., Japan: Oct. 4, 1994).

* cited by examiner

*Primary Examiner*—Vivian Chen
(74) *Attorney, Agent, or Firm*—Birch, Stewart, Kolasch & Birch, LLP

(57) ABSTRACT

A rubber for a hot press cushioning pad having a value of loss tangent (tan δ) in accordance with dynamic viscoelasticity measurement of at most 0.04, wherein the temperature condition is set at a hot press temperature ranging from 150° C. to 300° C., and the frequency condition is set to a time period of one press cycle ranging from 1 to $2\times10^4$ seconds.

33 Claims, 6 Drawing Sheets

RUBBER FOR HOT PRESS CUSHIONING PAD, MANUFACTURING METHOD THEREOF, HOT PRESS CUSHIONING PAD AND METHOD OF MANUFACTURING PRINTED CIRCUIT BOARD

BACKGROUND OF THE INVENTION

1. Field of the Invention

The present invention relates to a cushioning pad used for hot pressing, a rubber for the cushioning pad and manufacturing method thereof. Further, the present invention relates to a method of manufacturing a printed circuit board, an IC card, a liquid crystal display panel and the like and more preferably, a flexible printed circuit board (FPC), a build-up multilayer wiring board and the like, using the cushioning pad.

2. Description of the Background Art

When a printed circuit board is formed by hot pressing, a method is used in which an object to be pressed is put between heating platens, and a prescribed pressure and heat are applied thereto. In order that uniform pressure and heat are applied to the entire surface of the object of pressing, such pressing is performed with a flat, plate-shaped cushioning pad interposed between the object of pressing and the heating platen.

Conventionally, silicon rubber or fluoro rubber has been used as the cushioning pad.

Silicon rubber, however, has a problem that low-molecular gas of siloxane contained in the rubber and bleeding are generated, possibly staining a printed circuit board or the like, which is the object of pressing. Such stain deteriorates printing characteristic onto the printed circuit board, or deteriorates adhesion of the printed circuit board with other member such as a reinforcing plate, for example. Such tendency is accelerated as the cushioning pad is used longer. Such a stain presents a significant defect especially when the object of pressing is a precision apparatus component (for example, a flexible printed circuit board for a hard disc drive, or a build-up multilayer wiring board). Further, silicon rubber also has insufficient mechanical strength.

Japanese Patent Publication No. 7-12617 (Japanese Patent Laying-Open No. 6-278153) discloses an example of the cushioning pad using fluoro rubber. Compositions of the cushioning pad disclosed in this publication are represented as Comparative Examples 1 and 2 in Table 1.

As fluoro rubber is used, the cushioning pad disclosed in the aforementioned publication has improved heat resistance. In addition, the cushioning pad has superior cushioning property, thermal conductivity, durability and so on.

When the cushioning material and an object of pressing (for example, an FPC) having unevenness on its surface are brought into contact with each other directly or with a film or the like interposed, however, there is a problem that the unevenness tends to remain on the surface of the cushioning pad. In other words, the cushioning pad has insufficient strain recovery.

When hot pressing involves fluidization-setup of an adhesive, especially when the cushioning pad described above is used for joining a base film and a surface film with an adhesive in manufacturing the flexible printed circuit board (FPC), there is a problem that voids tend to remain in the FPC as the object of pressing.

SUMMARY OF THE INVENTION

The present invention was made to solve the above described problems. An object of the present invention is to provide a hot press cushioning pad having superior strain recovery, superior conformability, not generating any void in the object pressing and not generating low-pad, molecular gas or bleeding, and to provide rubber applied for the cushioning pad, manufacturing method thereof, and a method of manufacturing a printed circuit board using the cushioning pad.

The inventors of the present invention studied strain recovery of the rubber for hot press cushioning pad considering relation between press temperature and press cycle of hot press, fluid behavior of the adhesive inside the object of pressing and so on, and found that the rubber exhibited superior strain recovery when tan δ of the rubber for the cushioning pad under condition of use of hot press was 0.04 or lower.

According to an aspect of the present invention, the rubber has loss tangent value (tan δ) of 0.04 or lower measured by dynamic viscoelasticity measurement, when the temperature condition is set to the press temperature for hot press and frequency condition is set to the time corresponding to one press cycle of the hot press. The press temperature of hot press mentioned above refers to the highest temperature of the heating platen in one press cycle.

When the rubber is used as the cushioning pad for hot press and an object of pressing having unevenness on its surface (for example, an FPC) is hot-pressed, unevenness is not left on the surface of the cushioning pad. Therefore, superior cushioning property can be maintained for a long period of time.

The press temperature is 150° C. to 300° C., and the time corresponding to one press cycle is 1 to $2 \times 10^4$ seconds.

Preferable temperature condition is from 150° C. to 250° C., and preferable frequency condition is 1 to $1 \times 10^3$ seconds.

Under such conditions it is possible to adhere the base film and the surface film in manufacturing the flexible printed circuit board performed in a relatively short press cycle. Therefore, when the rubber having tan δ value of at most 0.04 is used as the cushioning pad under the above described conditions, superior strain recovery of the cushioning material is exhibited in the step of adhering the surface film, in manufacturing the flexible printed circuit board.

The rubber in accordance with another aspect of the present invention is for a cushioning pad used when objects of pressing are laminated and integrated by fluidization-setup of an adhesive by hot pressing, and the rubber has loss tangent value (tan δ) of 0.04 or lower measured by dynamic viscoelasticity measurement when frequency condition is set to the time period from the start of fluidization to the end of setup of the adhesive.

When the rubber is used as the hot press cushioning pad and objects of pressing (for example, FPC) laminated and integrated by fluidization-setup of an adhesive are hot-pressed, uneven pressure generated when the adhesive is fluidized can quickly be made uniform. As a result, generation of voids can effectively be prevented.

The adhesive here refers to one for joining two layers through the change of state of fluidization-setup as well as one which forms a layer by itself after fluidization-setup. Such adhesive may be a thermoplastic material or a thermosetting material. More specifically, it may be a hot melt adhesive or a pre-preg.

Generally, the press temperature mentioned above is 150° C. to 300° C., and the time period from the start of fluidization of the adhesive until the end of setup of the same is from 1 to $2\times10^3$ seconds.

Preferably, durometer hardness of the rubber in accordance with JIS (Japanese Industrial Standards) K6253 is A75 or lower.

Accordingly, as can be seen from Table 2, the durometer hardness can be made smaller than in the prior art, and hence conformability can be improved. As a result, by the synergistic effect with the aforementioned superior strain recovery, generation of void between the surface film and the base film can effectively be suppressed when a flexible printed circuit board having unevenness or level difference on its surface is adhered with a surface film.

Preferably, the rubber in accordance with the present invention mainly consists of fluoro rubber.

Therefore, a cushioning pad having superior heat resistance, high mechanical strength and almost free of exudation of mixed materials is provided.

Preferably, the rubber is a fluoro rubber composition containing fluoro rubber component of polyol vulcanization system, a vulcanizing agent, a vulcanization accelerator and an acid acceptor. The sum of the fluoro rubber component, the vulcanizing agent and the vulcanization accelerator occupies at least 80 vol. % of the entire fluoro rubber composition.

As the fluoro rubber of polyol vulcanization system is used, compression set of the cushioning pad can be made smaller, elongating the life of the cushioning pad. When bisphenol AF is used as the polyol vulcanizing agent, heat resistance can more effectively be improved.

The rubber in accordance with another aspect of the present invention is a fluoro rubber composition containing fluoro rubber component of polyol vulcanization system, a vulcanizing agent, a vulcanization accelerator and an acid acceptor. The sum of the fluoro rubber component, the vulcanizing agent and the vulcanization accelerator occupies at least 80 vol. % of the entire fluoro rubber composition.

The inventors have found that by such composition, it becomes possible to provide rubber of which tan δ value is 0.04 or lower. When such a rubber is used as the cushioning pad for hot press, a cushioning pad having superior strain recovery as described above is obtained.

The hot press cushioning pad in accordance with an aspect of the present invention includes rubber having tan δ value of 0.04 or lower when the temperature condition is set to the press temperature of hot pressing and the frequency condition is set to the time period corresponding to one press cycle of hot press.

Therefore, even when used repeatedly for hot press, superior strain recovery is exhibited, and superior cushioning property can be maintained for a long period of time.

In accordance with another aspect, the hot press cushioning material of the present invention is used for laminating and integrating objects of pressing by fluidization-setup of an adhesive by the hot press, and includes rubber having loss tangent value (tan δ) of 0.04 or lower, measured by dynamic viscoelasticity measurement when the temperature condition is set to the press temperature of hot press and the frequency condition is set to the time period from the start of fluidization to the end of setup of the adhesive.

Therefore, when objects of pressing (for example, FPC) to be laminated and integrated by fluidization-setup of the adhesive are hot-pressed using the cushioning pad, uneven pressure generated when the adhesive is fluidized can quickly be made uniform. As a result, generation of voids can effectively be suppressed.

In accordance with a still further aspect, the hot press cushioning pad of the present invention is of a fluoro rubber composition containing fluoro rubber component of polyol vulcanization system, a vulcanizing agent, a vulcanization accelerator and an acid acceptor, with the sum of the fluoro rubber component, the vulcanizing agent and the vulcanization accelerator being at least 80 vol. % of the entire fluoro rubber composition.

As the hot press cushioning pad is of the rubber of the aforementioned composition, strain recovery is improved.

Preferably, the surface of the rubber is subjected to releasing treatment.

Further, one or more layers formed of the aforementioned rubber, and at least one layer selected from the group consisting of woven fabric, non-woven fabric, paper, film, foil, sheet and plate may be laminated and integrated. The woven fabric, non-woven fabric, paper, film, foil, sheet and the plate is preferably a single or composite material selected from synthetic resin, natural rubber, synthetic rubber, metal and ceramics.

Preferably, at least one surface layer of the cushioning pad is formed of the rubber. More preferably, the surface of the rubber is subjected to releasing treatment.

The method of manufacturing the rubber for hot press cushioning pad in accordance with the present invention includes the following steps. A low material rubber, a vulcanizing agent, a vulcanization accelerator, an acid acceptor and a plasticizer are kneaded to prepare kneaded compound. The kneaded compound is processed to a sheet to form an unvulcanized rubber sheet. The unvulcanized rubber sheet is subjected to primary cure to provide vulcanized rubber sheet. The vulcanized rubber sheet is subjected to secondary cure at a temperature not lower than the boiling point of the plasticizer, so as to volatilize the plasticizer.

By the secondary cure, vulcanization is completed, excessive vulcanizing agent is dissolved, gas generated during vulcanization is dissipated, and residual strain can be eliminated. In addition, strain recovery is improved. Further, as the plasticizer can be volatilized by the secondary cure, exudation of the plasticizer during the use of the cushioning pad can be prevented.

By the secondary cure, preferably, the value of tan δ is set to 0.04 or lower.

The method of manufacturing a printed circuit board in accordance with an aspect of the present invention is for manufacturing a printed circuit board by placing a material of a printed circuit board and the cushioning pad stacked and placed between heating platens and heated pressed, in which the cushioning pad contains rubber having tan δ value of 0.04 or lower, when the temperature condition is set to the press temperature of the hot press and the frequency condition is set to the time corresponding to one press cycle of the hot press.

The method of manufacturing a printed circuit board in accordance with another aspect of the present invention is for manufacturing a printed circuit board in which printed circuit board material having laminated structure and the cushioning pad are stacked and placed between heating platens and the printed circuit board material is laminated and integrated by fluidization-setup of an adhesive by hot-pressing, and the cushioning pad contains rubber having loss tangent value (tan δ) of 0.04 or lower, when measured by dynamic viscoelasticity measurement with the temperature condition set to the press temperature of the hot press and the frequency condition is set to the time period from the start of fluidization to the end of setup of the adhesive.

The method of manufacturing a printed circuit board in accordance with a still further aspect of the present invention uses a cushioning pad of the following composition. The cushioning pad has a fluoro rubber composition containing fluoro rubber component of polyol vulcanization system, a vulcanizing agent, a vulcanization accelerator and an acid acceptor, with the sum of the fluoro rubber component, the vulcanizing agent and the vulcanization accelerator being at least 80 vol. % of the entire fluoro rubber composition.

By the method of manufacturing the printed circuit board, it becomes possible to manufacture a printed circuit board of high quality free of void or shrink, having high smoothness and not susceptible to staining.

The printed circuit board has uneven pattern on its surface.

The printed circuit board is, for example, a flexible printed circuit board or a build-up multilayer wiring board.

The cushioning pad including the rubber in accordance with the present invention is effective for hot pressing such a printed circuit board.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
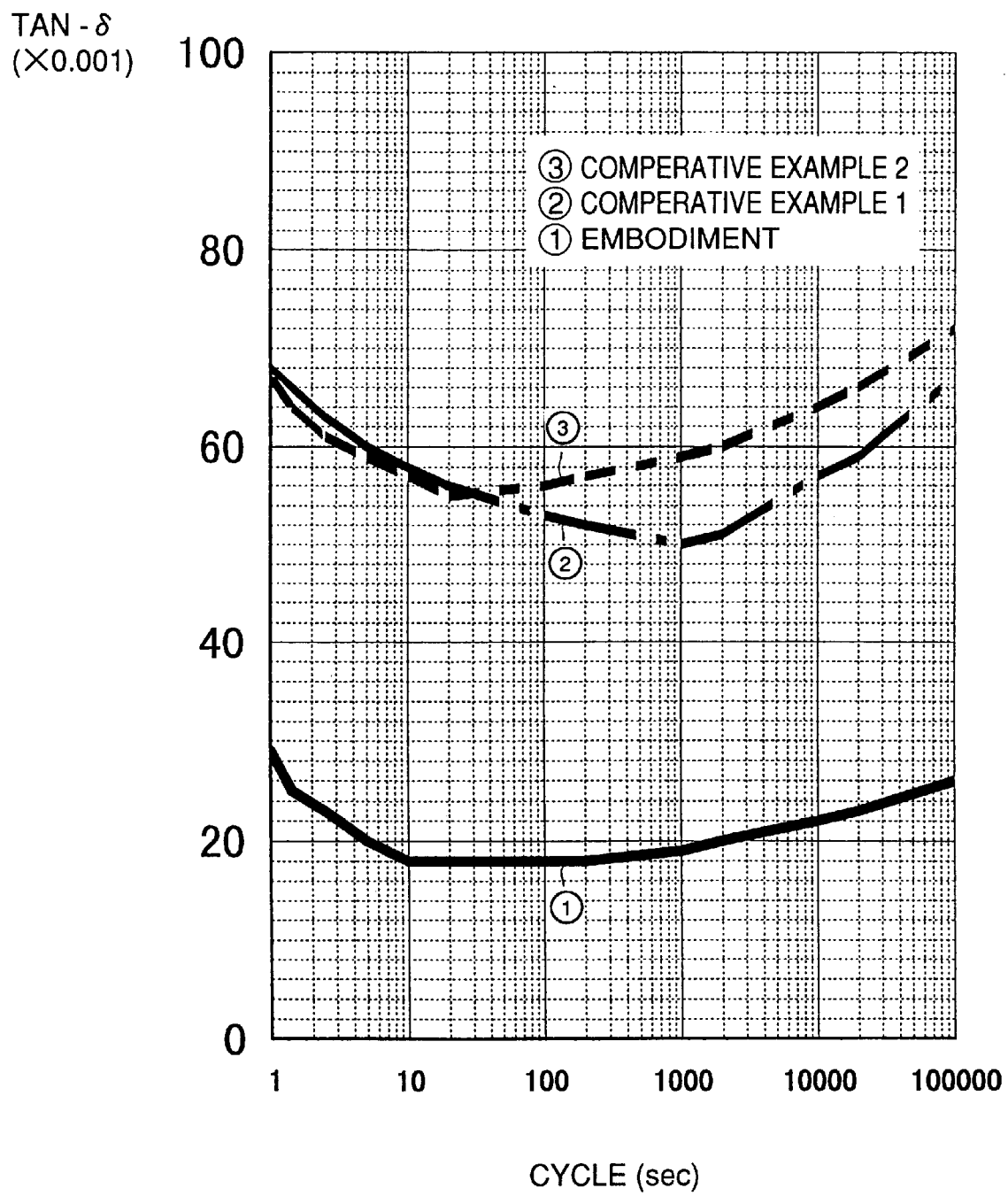
FIG. 1 is a graph representing the values of tan δ of an embodiment of the present invention and of Comparative Examples 1 and 2.

Embodiments of the present invention will be described in the following.

Table 1 represents mixture ratio of an embodiment of the present invention and of Comparative Examples 1 and 2 (corresponding to samples 1 and 2 of Japanese Patent Publication No. 7-12617).

TABLE 1

| Composition | | | Specific Gravity | Embodiment | Comparative Example 1 | Comparative Example 2 |
|---|---|---|---|---|---|---|
| Fluoro rubber | with polyol vulcanizing agent | (1) | 1.81 | 100 (86.6%) | | |
| | with polyol vulcanizing agent | (2) | 1.81 | | 100 (45.3%) | 100 (67.9%) |

TABLE 1-continued

| Composition | | | Specific Gravity | Embodiment | Comparative Example 1 | Comparative Example 2 |
|---|---|---|---|---|---|---|
| Acid acceptor | high-activity MgO | (3) | 3.5 | 7 (3.1%) | | |
| | MgO | (4) | 3.4 | | 12.5 (3.0%) | 15.0 (5.4%) |
| | ZnO | | 5.5 | | | 25.0 (5.6%) |
| Filler | low-activity MgO | (5) | 3.5 | 15 (6.7%) | | |
| | Hollow glass beads | (6) | 1.1 | | 55.0 (41.0%) | 15.0 (16.8%) |
| Plasticizer | Dioctyl adipate | | 0.95 | 1 (0%) | | |
| | Acrylic ester | (7) | 1.12 | | 6.8 (5.0%) | |
| | Acrylic ester | (8) | 1.11 | | 5.6 (4.1%) | |
| Coupling agent | Vinyl titanate type | (9) | 1 | 0.25 (0.4%) | | |
| Vulcanizing agent | Organic peroxide | (10) | 1 | | 0.2 (0.2%) | |
| Vulcanization accelerator | Ca(OH)$_2$ | | 2.2 | 4 (2.9%) | 3.3 (1.2%) | 5.0 (2.8%) |
| Lubricant | Stearic acid | | 0.84 | | | 0.8 (1.2%) |
| Pigment | Red oxide | | 4.6 | 1 (0.3%) | | |
| | | (11) | | | 0.2 (0.2%) | 0.3 (0.4%) |

Upper half: weight part
Lower half: (vol. % after vulcanization)
(1)DAI-EL G-716 (with polyol vulcanizing agent):Daikin Industries. Ltd.
(2)DAI-EL G-755C (with polyol vulcanizing agent):Daikin Industries. Ltd.
(3)MICROMAG 3-150:Kyowa Chemical Industry Co. Ltd.
(4)MAGSARAT 30:Kyowa Chemical Industry Co. Ltd.
(5)PYROKISUMA 5301:Kyowa Chemical Industry Co. Ltd.
(6)HSC110A:Toshiba-Ballotini Co. Ltd.
(7)2.2'-bis(4-methacryloxydiethoxyphenyl)propane
(8)phenoxydiethyleneglycolacrylate
(9)PLENACT KR-TTS:Ajinomoto Co., Inc.
(10)VUL-CUP 40KE:HERCULES
(11)epsilon red LB-ITO34:Sumika Color Company, Limited Respective materials were kneaded with the mixture ratios of Table 1 to prepare fluoro rubber compositions, and by using two rolls, unvulcanized fluoro rubber sheets in accordance with an embodiment of the present invention and Comparative Examples 1 and 2 were fabricated. Thereafter, press vulcanization primary cure) of 170° C.×30 minutes in a mold was performed, to fabricate vulcanized fluoro rubber sheets having the thickness of 2 mm. The vulcanized fluoro rubber sheet in accordance with the embodiment of the invention was further subjected to secondary cure of 230° C.×24 hours in an oven. The secondary cure should be performed at a temperature not lower than the boiling point of the plasticizer. Therefore, the plasticizer can be volatalized, and hence exudation of the plasticizer can be prevented when the rubber sheet in accordance with the present invention is used as a cushioning pad for hot pressing.

When a rubber sheet having a laminated structure is to be formed, unvulcanized rubber sheets are stacked and adhered to each other by primary cure. The condition for the primary cure is 160° C. to 200° C. for 5 minutes to 120 minutes, with 1 kg/cm$^2$ to 20 kg/cm$^2$.

The secondary cure should preferably be performed at a temperature not lower than the boiling temperature of the plasticizer as described above, and not lower than the temperature of use of the hot press. If the temperature of the secondary cure is too low, the effect of the secondary cure cannot be attained, and if the temperature is too high, the rubber deteriorates. Therefore, preferable temperature of the secondary cure is 200° C. to 260° C.

The time for the secondary cure is at least one hour (preferably, 4 to 30 hours). If the time is too short, the effect of secondary cure is not attained. If the time is too long, no extra effect can be expected, while there is a possibility of deterioration of the rubber, and in addition, time is wasted.

In the secondary cure, pressure is not applied. Further, secondary cure should preferably be performed with at least one surface of the rubber kept in a state having permeability. This facilitates effective volatilization of the plasticizer.

The state having permeability refers to a state where the rubber does not have any layer laminated on its surface, or a permeable material such as woven fabric, non-woven fabric or paper is laminated on its surface.

The values of loss tangent (tan δ) in accordance with dynamic viscoelasticity measurement of the rubber sheets described above were measured by the following method and apparatus of measurement. Using viscoelastic spectrometer (manufactured by Iwamoto Seisakusho Co. ltd.: TYPE VES-FIII), the values were measured by forced oscillation non-resonance method (phase difference method). The results are as shown in FIGS. 1 to 4.

FIG. 1 shows the result of comparison of master curves (150° C.) of tan δ. The master curves were formed in accordance with known time-temperature converting rule, for the cycle range of 1 to $1 \times 10^5$ seconds.

As can be seen from FIG. 1, the value of tan δ of the rubber sheet in accordance with the present invention is 0.04 or lower, while the values of tan δ of Comparative Examples 1 and 2 are larger than 0.04. As the value of tan δ can be made smaller than the prior art, strain recovery can be improved from the prior art. The rubber sheet having such property is effective as a cushioning pad for hot pressing a product having unevenness or contour on its surface. The value closer to 0 is preferable for tan δ.

Figure 2:
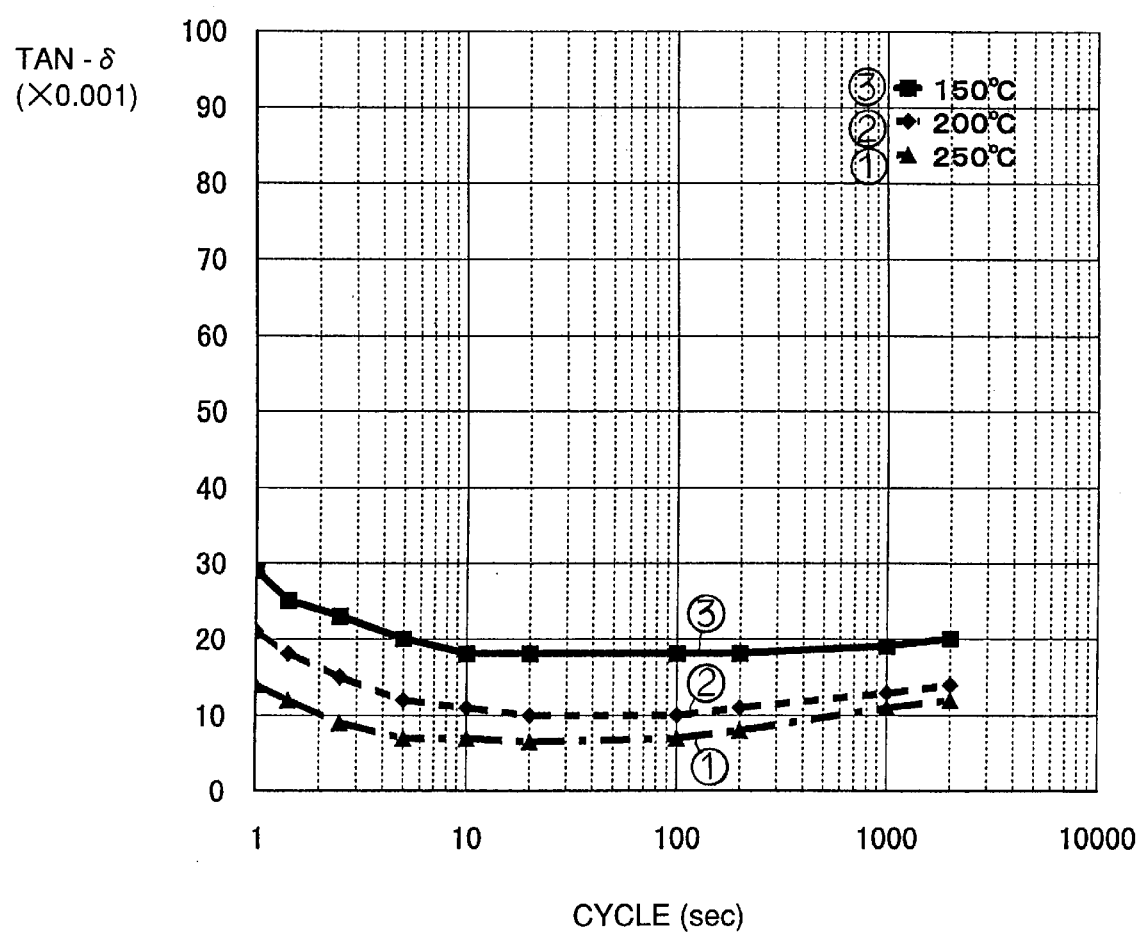
FIG. 2 is a graph representing frequency dependence of tan δ of an embodiment of the present invention.
Figure 3:
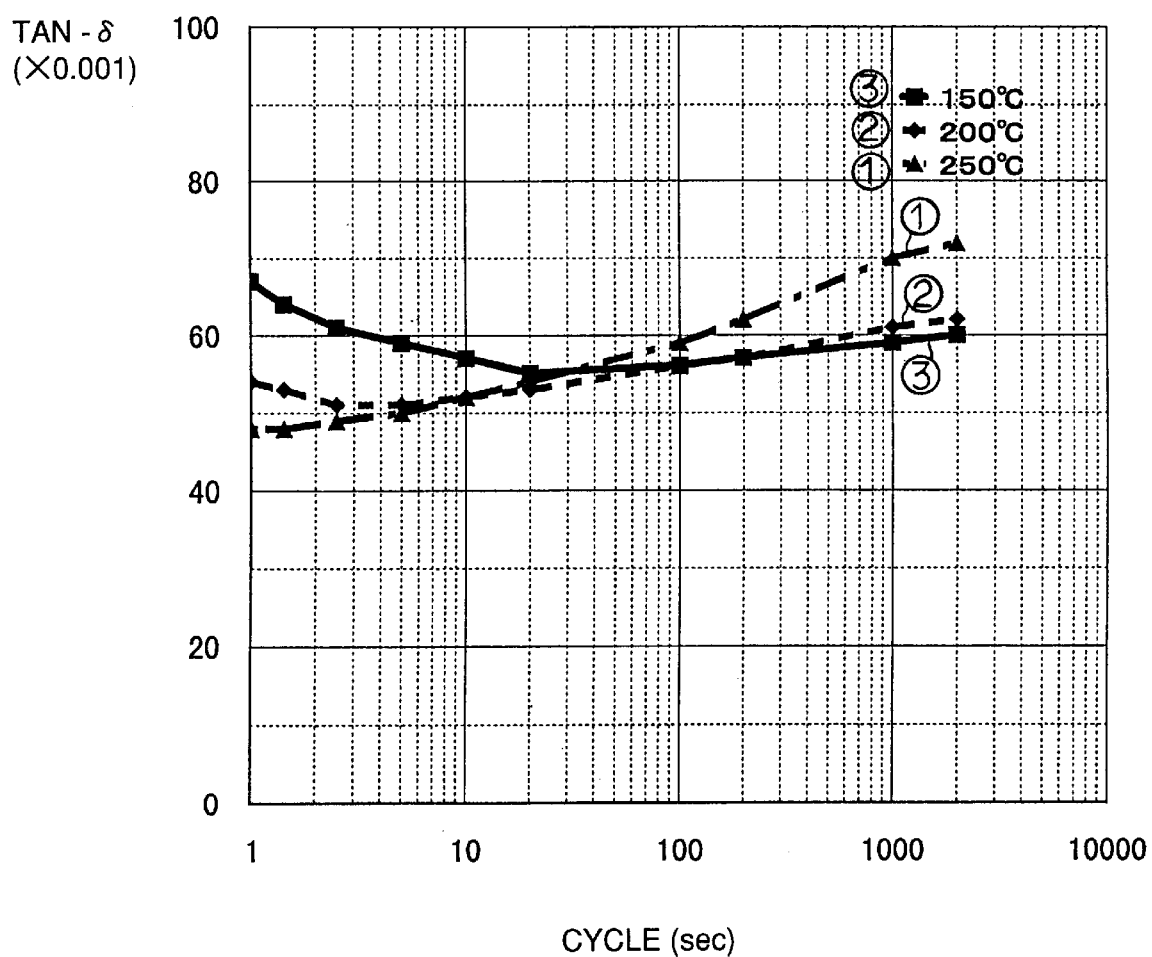
FIG. 3 is a graph representing frequency dependence of tan δ of Comparative Example 1.
Figure 4:
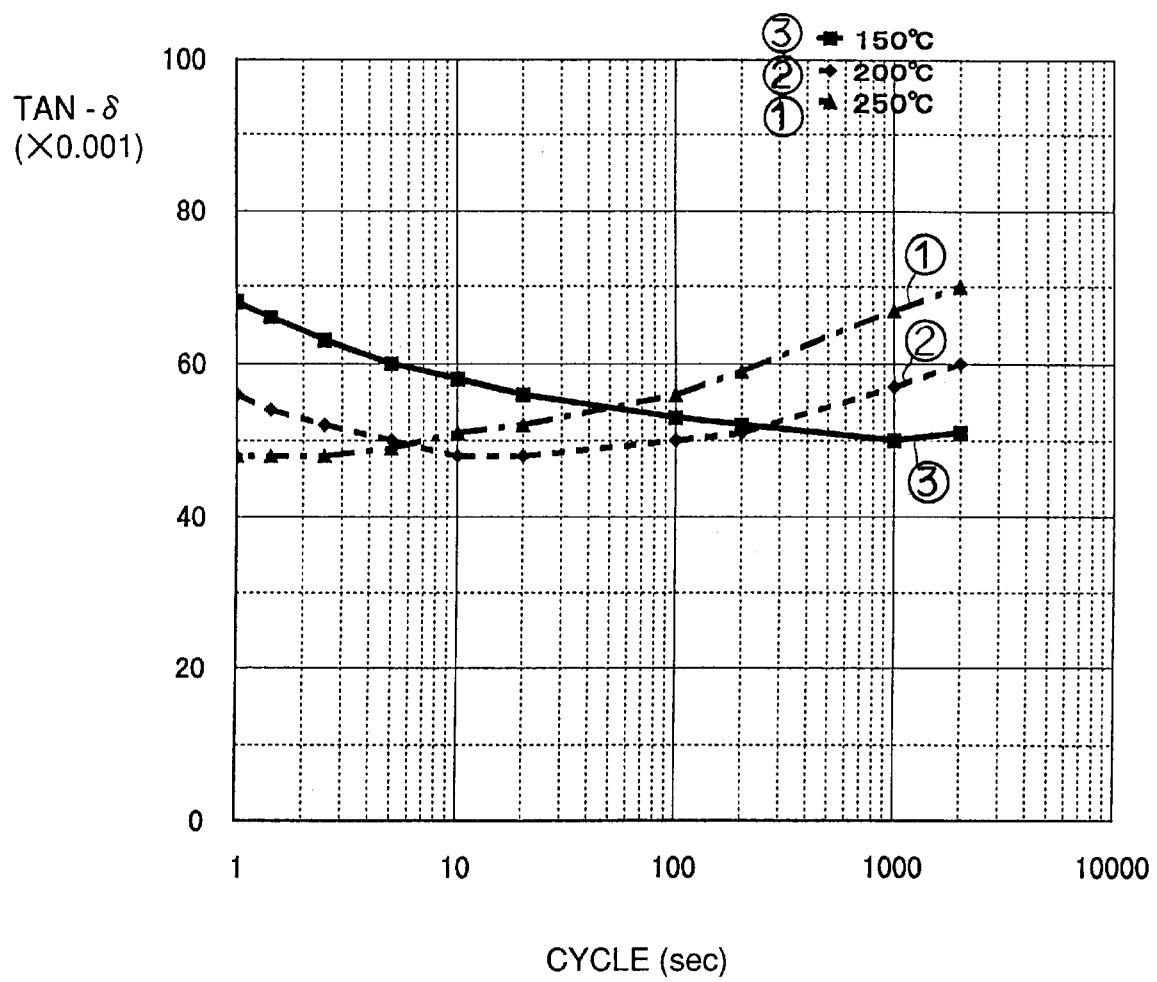
FIG. 4 is a graph representing frequency dependence of tan δ of Comparative Example 2.

Frequency dependence of tan δ of the present embodiment and Comparative Examples 1 and 2 at the temperature of 150° C., 200° C. and 250° C., will be described with reference to FIGS. 2 to 4. In FIGS. 2 to 4, the cycle is set to be within the range of 1 to $2 \times 10^3$ seconds. This cycle is based on the time period from the start of fluidization until the end of setup of the adhesive in the object of pressing. A typical example of the hot press in this cycle range includes the step of adhering a surface film in manufacturing a flexible printed circuit board.

As can be seen from FIG. 2, at any temperature, the value of tan δ of the rubber sheet in accordance with the embodiment of the present invention is 0.04 or lower. By contrast, as shown in FIGS. 3 and 4, the values of tan δ of Comparative Examples are, at any temperature, higher than 0.04.

From this result, it is understood that the rubber sheet in accordance with the present invention exhibits superior elasticity in a cycle corresponding to the time period (1 to $2 \times 10^3$ seconds) from the start of fluidization to the end of setup of the adhesive in the object of pressing. Therefore, when the rubber sheet in accordance with the present invention is used for a cushioning pad for hot press, uneven internal stress generated when the adhesive in the object of pressing is fluidized can be made uniform quickly, and hence generation of voids can effectively be prevented.

Durometer hardness of the embodiment of the invention and Comparative Examples in accordance with JIS (Japanese Industrial Standards) K6253 will be compared, referring to Table 2.

TABLE 2

|  | Embodiment | Comparative Example 1 | Comparative Example 2 |
|---|---|---|---|
| Durometer hardness (JISK6253) | A60 | A87 | A78 |

As can be seen from Table 2, durometer hardness of the rubber sheet in accordance with the embodiment of the invention is smaller than Comparative Examples 1 and 2. As the durometer hardness is made small, conformability to the contour can be improved. In addition, by the synergistic effect with the superior strain recovery as shown in FIGS. 2 to 4, generation of voids can effectively be suppressed when a product having unevenness or up and down is hot-pressed.

From the results shown in Table 2, durometer hardness of A75 or lower is considered effective to improve conformability to the contour or level difference, at least as compared with the Comparative Examples. Preferably, durometer hardness should be at most A70 and, more preferably at most A65. Here, it is necessary that the durometer hardness is at least A10.

The shape of the rubber in accordance with the present invention may be solid or foam.

The composition of the embodiment shown in Table 1 will be described in greater detail. As to the fluoro rubber as the main component, any of polyamine vulcanization system, polyol vulcanization system and organic peroxide vulcanization system may be used. Use of the fluoro rubber as the main component provides superior heat resistance, high strength, and suppressed exudation of the mixed material.

Particularly, when fluoro rubber of polyol vulcanization system is used, compression set can be reduced, and hence rubber comes to have longer life. As the polyol vulcanizing agent, four types as represented by the following chemical formulas 1 (a)–(d) may be used. Among these, bisphenol AF shown in (a) has the highest heat resistance.

Formulas 1

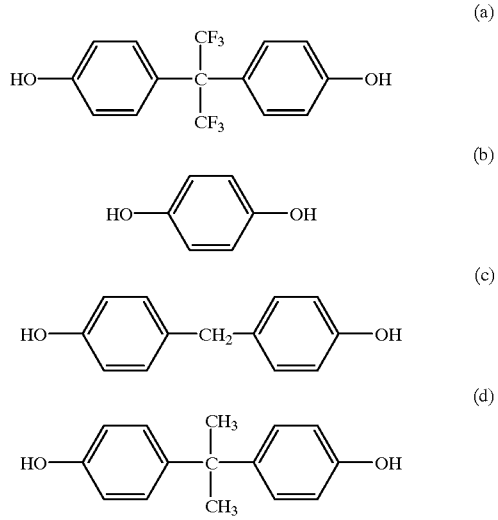

As shown in Table 1, the sum of the fluoro rubber, the vulcanizing agent and the vulcanization accelerator should preferably be at least 80 vol. % with respect to the entire fluoro rubber composition. Preferably, the sum should be at least 85 vol. %. Such composition enabled lower value of tan δ, and rubber having superior strain recovery could be obtained.

The vulcanization accelerator will be described next. Preferable vulcanization accelerator includes organic phosphonium salt represented by the chemical formula of $R_4 P^+ X^-$ and quaternary ammonium salt represented by $R_4 N^+ X^-$.

As to the plasticizer, one having low boiling point, that is, one having the boiling point not higher than the temperature of use in the press for hot pressing, for example, should preferably be used. The amount of use of plasticizer is 0.5 to 5 (preferably, 1 to 2) part by weight with respect to 100 parts by weight of rubber. If the amount is smaller than 0.5 part by weight, the effect of improving processability decreases, and when the amount is too large, dimensional stability after the plasticizer is volatilized is degraded.

The plasticizer may include di-n-octyl phthalate, diisooctyl phthalate, diisononyl phthalate, dimethyl isophthalate, di(2-ethylhexyl)adipate, diisodecyl adipate, di(n-octyl,n-decyl)adipate, benzyl octyl adipate, dibutyl diglycol adipate, di-n-alkyl adipate, di-n-alkyl ($C_{6,8,10}$) adipate, di(2-ethylhexyl)azelate, di-n-hexyl azelate, di-2-ethylhexyl dodecanedioate, dimethyl maleate, diethyl maleate, di(2-ethylhexyl) maleate, di-(2-ethylhexyl)fumarate, triethyl citrate, tri-n-butyl citrate, acetyl triethyl citrate, monomethyl itaconate, dimethyl itaconate, butyl oleate, methyl acetyl recinoleate, and n-butyl stearate.

When the rubber in accordance with the present invention as described above is used as a cushioning pad for hot press, it is preferable that the surface of the rubber is subjected to releasing treatment. Releasing treatment not degrading rubber property is preferred. Specifically, a synthetic resin film adhered on the surface of the rubber, uniform roughening of the rubber surface, ultraviolet ray irradiation, electric ray irradiation and the like may be possible.

Preferable synthetic resin film includes a film formed of a fluoro resin such as polytetrafluoroethylene (PTFE), tetrafluoroethylene-perfluoroalkyl vinyl ether copolymer (PFA) or tetrafluoroethylene-hexafluoropropylene copolymer (FEP) and polyimide.

Preferably, the synthetic resin film should have the thickness of at most 200 μm. More preferably, the thickness of the synthetic resin film is 10 μm to 50 μm.

The synthetic resin film should preferably has its surface to be adhered to the rubber processed by corona discharge, acid, or the like in advance. This improves adhesion between the synthetic resin film and the rubber, and without using any specific adhesive, it becomes possible to adhere the synthetic resin film and the rubber at the time of primary cure of the rubber. When the adhesive is not used, the cushioning pad having superior conformability to the contour or recess and projection is obtained, improving elasticity of the rubber on the surface of the cushioning pad.

A synthetic resin film having an adhesive applied in advance on the surface to be adhered with rubber may be used. In that case, adhesion of the synthetic resin film after secondary cure of the rubber is possible. Therefore, secondary cure of the rubber is possible with the synthetic resin film not adhered yet, and therefore efficiency of secondary cure is improved.

In order to uniformly roughen the surface of the rubber, a method of transferring from a transfer material such as a mold, a metal plate, a woven fabric or the like having rough surface may be used. Either physical or chemical processing may be performed. When the rubber surface is to be made rough, the surface roughness should preferably be in the range of 5 μm to 100 μm in terms of arithmetical mean roughness (Ra) defined in JISB0601.

As the cushioning pad for hot press, one or more layers formed of the above described rubber and one or more layers formed of at least one selected from the group consisting of woven fabric, non-woven fabric, paper, film, foil, sheet and plate may be combined, laminated and integrated. The woven fabric, non-woven fabric, paper, film, foil, sheet and plate are preferably formed of a single material or a composite material selected from the group consisting of synthetic resin, natural rubber, synthetic rubber, metal and ceramics.

Figure 6A:
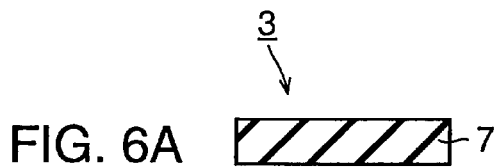
FIGS. 6A to 6L are cross sections representing specific examples of the structure of the cushioning pad.
Figure 6B:
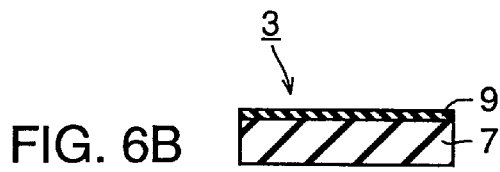
Figure 6C:
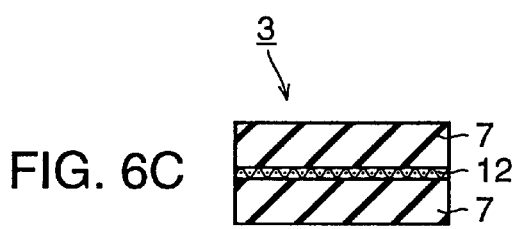
Figure 6D:
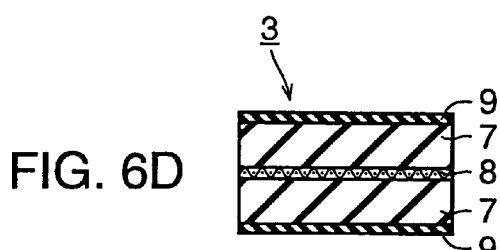
Figure 6E:
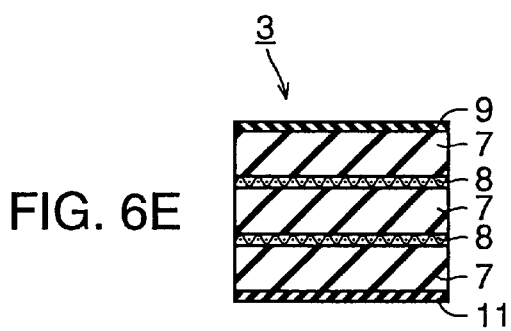
Figure 6F:
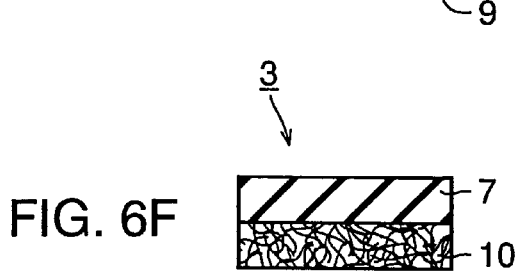
Figure 6G:
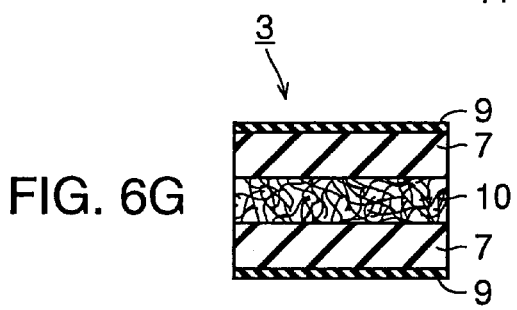
Figure 6H:
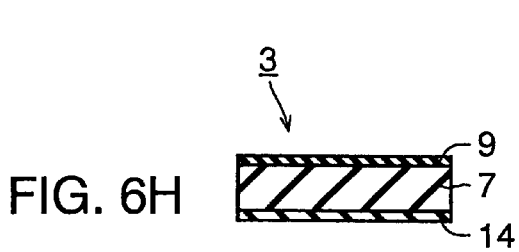
Figure 6I:
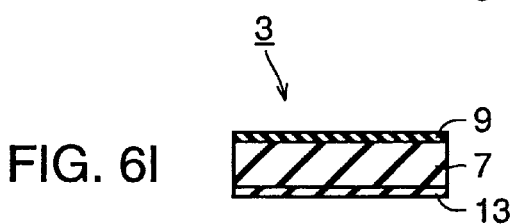
Figure 6J:
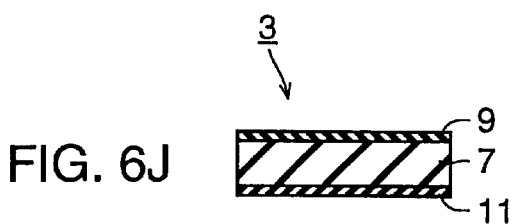
Figure 6K:
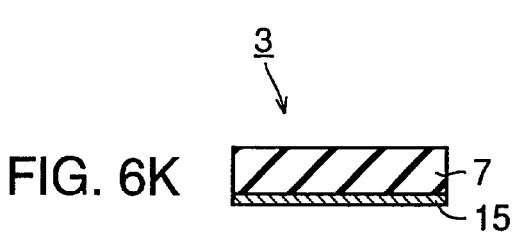
Figure 6L:
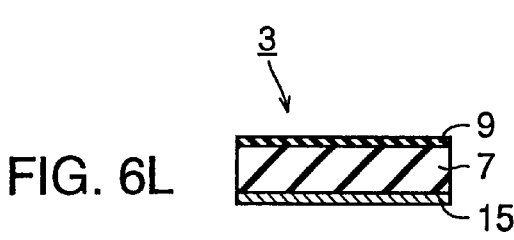

FIGS. 6A to 6L show specific examples of the structure of cushioning pad 3. Referring to FIG. 6A, a single fluoro rubber 7 may be used as cushioning pad 3, while as shown in FIGS. 6B to 6L, fluoro rubber 7 may be laminated and integrated with glass cloth 8, fluoro resin film 9, aromatic polyamide non-woven fabric 10, a surface layer 11 having a glass cloth with opposing surfaces coated with fluoro rubber and further coated with polyimide resin, an aromatic polyamide cloth 12, a layer 13 having a glass cloth coated with fluoro resin, a polyimide film 14 or an aluminum plate 15.

The thickness of fluoro rubber 7 mentioned above is, for example, 0.5 mm. The thickness of fluoro resin film 9 is, for example, 25 μm.

To address an object of pressing having uneven pattern on its surface, at least one surface layer of the laminated body is preferably formed of rubber. The thickness of the surface rubber layer is, for example, 0.1 mm to 3.0 mm. More preferably, the thickness of the surface rubber layer is 0.3 mm to 1.0 mm. If the thickness of the surface rubber layer is too small, it becomes difficult to form a uniform sheet. When the thickness of the surface rubber layer is too large, the amount of deformation of rubber caused by press pressure increases, resulting in breakage of rubber, and hence lower durability. Therefore, by setting the thickness of the surface rubber layer within the above described range, a surface rubber layer which can be easily formed to a uniform sheet and having high durability is obtained.

When the surface rubber layer is provided, preferably, the surface of the surface rubber layer is subjected to the above described releasing treatment. The fluoro resin film 9 shown in FIGS. 6A to 6L is an example of the releasing treatment.

An example of the method of hot press when the rubber in accordance with the present invention is used as the cushioning pad for hot press will be described in the following.

Figure 5:
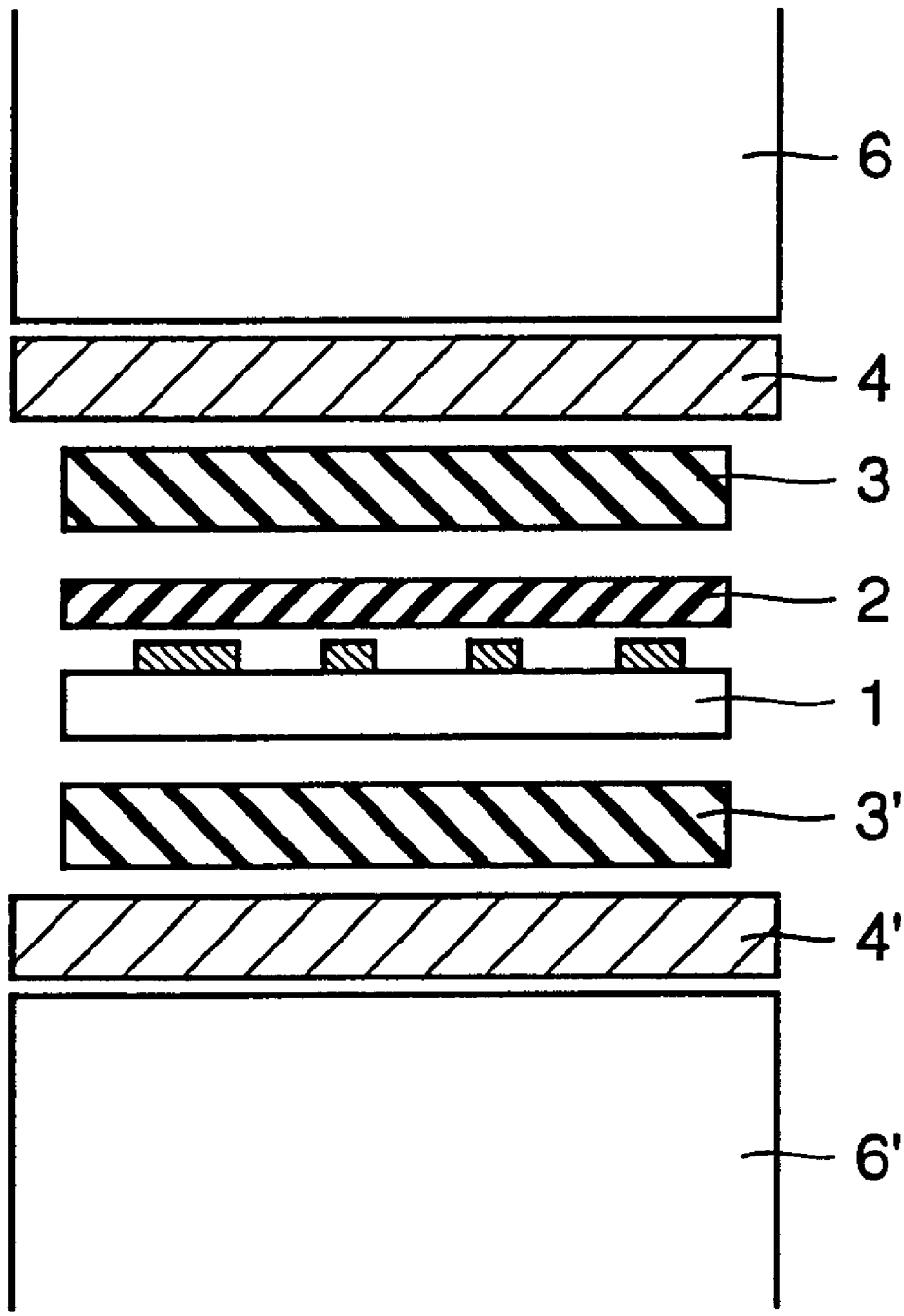
FIG. 5 is an illustration of a method of hot pressing using the cushioning pad in accordance with the present invention.

As shown in FIG. 5, mirror plates 4, 4' formed of stainless steel, cushioning pads 3, 3', a flexible printed circuit board 1 and a cover lay film 2 are arranged between heating platens 6, 6', and the flexible printed circuit board 1 and cover lay film 2 (material of the printed circuit board) are heated and pressed.

Here, as the rubber in accordance with the present invention is used as cushioning pads 3, 3', the strain recovery and contour or recess and projection conformability of cushioning pads 3, 3' can be improved as described above. Accordingly, superior cushioning property of the cushioning pads 3, 3' can be maintained for a long period of time, and generation of voids in the flexible printed circuit board 1 can effectively be prevented. Further, generation of gas at the time of pressing, volatilization of decomposed molecule and bleeding can be avoided. Further, strain on the flexible printed circuit board 1 and peripheral equipments can be prevented. Further, as the rubber mainly consisting of fluoro rubber is used, cushioning pads 3, 3' having superior heat resistance and high strength can be obtained. Thus, durability of cushioning pads 3, 3' can be improved.

The cushioning pads 3, 3' using the rubber in accordance with the present invention is widely applicable to hot pressing a build-up multilayer wiling board, other printed circuit boards and any other hot press, in addition to the flexible printed circuit board 1 described above.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A rubber for hot press cushioning pad, having a value of loss tangent (tan δ) in accordance with dynamic viscoelasticity measurement of at most 0.04, when temperature condition is set to press temperature of hot press, and frequency condition is set to a time period corresponding to one press cycle of the hot press, wherein said press temperature ranges from 150° C. to 300° C., and the time period corresponding to one press cycle is 1 to $2\times10^4$ seconds.

2. The rubber for hot press cushioning pad according to claim 1, having durometer hardness of at most A75.

3. The rubber for hot press cushioning pad according to claim 1, mainly consisting of fluoro rubber.

4. The rubber for hot press cushioning pad according to claim 3 wherein said rubber is a fluoro rubber composition containing a fluoro rubber component of a polyol vulcanization system, a vulcanizing agent, a vulcanization accelerator and an acid acceptor, the sum of said fluoro rubber component, the vulcanizing agent and the vulcanization accelerator being at least 80 vol. % of said fluoro rubber composition.

5. A rubber for hot press cushioning pad used for laminating and integrating objects of pressing by fluidization-setup of an adhesive by hot pressing, said rubber having a value of loss tangent (tan δ) in accordance with dynamic viscoelasticity measurement of at most 0.04, when temperature condition is set to press temperature of said hot press, and frequency condition is set to a time period from start of fluidization to end of setup of said adhesive, wherein said press temperature ranges from 150° C. to 300° C., and the frequency condition is 1 to $2\times10^3$ seconds.

6. The rubber for hot press cushioning pad according to claim 5, having durometer hardness of at most A75.

7. The rubber for hot press cushioning pad according to claim 5, mainly consisting of fluoro rubber.

8. The rubber for hot press cushioning pad according to claim 7, wherein said rubber is a fluoro rubber composition containing a fluoro rubber component of a polyol vulcanization system, a vulcanizing agent, a vulcanization accelerator and an acid acceptor, the sum of said fluoro rubber component, the vulcanizing agent and the vulcanization accelerator being at least 80 vol. % of entire said fluoro rubber composition.

9. A hot press cushioning pad, comprising rubber having a value of loss tangent (tan δ) in accordance with dynamic viscoelasticity measurement of at most 0.04, when the temperature condition is set to press temperature of the hot press, and frequency condition is set to a time period corresponding to one press cycle of the hot press, wherein said press temperature ranges from 150° C. to 300° C., and the time period corresponding to one press cycle is 1 to $2\times10^4$ seconds.

10. The hot press cushioning pad according to claim 9, wherein a surface of said rubber is subjected to releasing treatment.

11. The hot press cushioning pad according to claim 9, having at least one layer formed of said rubber and at least one layer formed of at least one selected from the group consisting of woven fabric, non-woven fabric, paper, film, foil, sheet and plate, said layers being laminated and integrated.

12. The hot press cushioning pad according to claim 11, wherein said woven fabric, non-woven fabric, paper, film, foil, sheet and plate are single or composite materials selected from the group consisting of synthetic resin, natural rubber, synthetic rubber, metal and ceramics.

13. The hot press cushioning pad according to claim 11, wherein at least one surface layer is formed of said rubber.

14. The hot press cushioning pad according to claim 13, wherein a surface of said rubber is subjected to releasing treatment.

15. A hot press cushioning pad used for laminating and integrating objects of pressing by fluidization-setup of an adhesive by hot-pressing, comprising a rubber having a value of loss tangent (tan δ) in accordance with dynamic viscoelasticity measurement of at most 0.04, when temperature condition is set to press temperature of said hot press, and frequency condition is set to a time period from start of fluidization to end of setup of said adhesive, wherein said press temperature ranges from 150° C. to 300° C., and the frequency condition is 1 to $2\times10^3$ seconds.

16. The hot press cushioning pad according to claim 15, wherein a surface of said rubber is subjected to releasing treatment.

17. The hot press cushioning pad according to claim 15, having at least one layer formed of said rubber and at least one layer formed of at least one selected from the group consisting of woven fabric, non-woven fabric, paper, film, foil, sheet and plate, said layers being laminated and integrated.

18. The hot press cushioning pad according to claim 17, wherein said woven fabric, non-woven fabric, paper, film, foil, sheet and plate are single or composite materials selected from the group consisting of synthetic resin, natural rubber, synthetic rubber, metal and ceramics.

19. The hot press cushioning pad according to claim 17, wherein at least one surface layer is formed of said rubber.

20. The hot press cushioning pad according to claim 19, wherein a surface of said rubber is subjected to releasing treatment.

21. A method of manufacturing a rubber for hot press cushioning pad, comprising the steps of kneading a raw material rubber, a vulcanizing agent, a vulcanization accelerator, an acid acceptor and a plasticizer to form a kneaded compound;

processing said kneaded compound to a sheet to form an unvulcanized rubber sheet;

primary-curing said unvulcanized rubber sheet to provide a vulcanized rubber sheet; and secondary-curing said vulcanized rubber sheet at a temperature not lower than a boiling point of said plasticizer to volatilize said plasticizer.

22. The method of manufacturing a rubber for hot press cushioning pad according to claim 21, wherein a value of loss tangent (tan δ) in accordance with dynamic viscoelasticity measurement is made at most 0.04 by said secondary curing, wherein said press temperature ranges from 150° C. to 300° C., and the time period corresponding to one press cycle is 1 to $2 \times 10^4$ seconds.

23. The method of manufacturing a rubber for hot press cushioning pad according to claim 21, wherein a value of loss tangent (tan δ) in accordance with dynamic viscoelasticity measurement is made at most 0.04 by said secondary curing, wherein said press temperature ranges from 150° C. to 250° C., and the frequency condition is 1 to $1 \times 10^3$ seconds.

24. A rubber for hot press cushioning pad, having a value of loss tangent (tan δ) in accordance with dynamic viscoelasticity measurement of at most 0.04, when temperature condition is set to press temperature of hot press, and frequency condition is set to a time period corresponding to one press cycle of the hot press, wherein said press temperature ranges from 150° C. to 250° C., and the frequency condition is 1 to $1 \times 10^3$ seconds.

25. The rubber for hot press cushioning pad according to claim 24 having durometer hardness of at most A75.

26. The rubber for hot press cushioning pad according to claim 24, mainly consisting of fluoro rubber.

27. The rubber for hot press cushioning pad according to claim 26, wherein said rubber is a fluoro rubber composition containing a fluoro rubber component of a polyol vulcanization system, a vulcanizing agent, a vulcanization accelerator and an acid acceptor, the sum of said fluoro rubber component, the vulcanizing agent and the vulcanization accelerator being at least 80 vol. % of said fluoro rubber composition.

28. A hot press cushioning pad, comprising rubber having a value of loss tangent (tan δ) in accordance with dynamic viscoelasticity measurement of at most 0.04, when the temperature condition is set to press temperature of the hot press, and frequency condition is set to a time period corresponding to one press cycle of the hot press, wherein said press temperature ranges from 150° C. to 250° C., and the frequency condition is 1 to $1 \times 10^3$ seconds.

29. The hot press cushioning pad according to claim 28, wherein a surface of said rubber is subjected to releasing treatment.

30. The hot press cushioning pad according to claim 28, having at least one layer formed of said rubber and at least one layer formed of at least one selected from the group consisting of woven fabric, non-woven fabric, paper, film, foil, sheet and plate, said layers being laminated and integrated.

31. The hot press cushioning pad according to claim 30, wherein said woven fabric, non-woven fabric, paper, film, foil, sheet and plate are single or composite materials selected from the group consisting of synthetic resin, natural rubber, synthetic rubber, metal and ceramics.

32. The hot press cushioning pad according to claim 30, wherein at least one surface layer is formed of said rubber.

33. The hot press cushioning pad according to claim 32, wherein a surface of said rubber is subjected to releasing treatment.

* * * * *

UNITED STATES PATENT AND TRADEMARK OFFICE
CERTIFICATE OF CORRECTION

PATENT NO.    : 6,391,460 B1
DATED         : May 21, 2002
INVENTOR(S)   : Atsuo Tanaka et al.

It is certified that error appears in the above-identified patent and that said Letters Patent is hereby corrected as shown below:

<u>Title page, Item [54] and Column 1, lines 1-5,</u>
Please change the title of the invention from "RUBBER FOR HOT PRESS CUSHIONING PAD, MANUFACTURING METHOD THEREOF, HOT PRESS CUSHIONING PAD AND METHOD OF MANUFACTURING PRINTED CIRCUIT BOARD" to -- RUBBER FOR HOT PRESS CUSHIONING PAD, MANUFACTURING METHOD THEREOF AND HOT PRESS CUSHIONING PAD --.

Signed and Sealed this

Twentieth Day of May, 2003

JAMES E. ROGAN
*Director of the United States Patent and Trademark Office*